United States Patent
Kang et al.

[11] Patent Number: 5,446,587
[45] Date of Patent: Aug. 29, 1995

[54] PROJECTION METHOD AND PROJECTION SYSTEM AND MASK THEREFOR

[75] Inventors: Ho-young Kang; Cheol-hong Kim; Seong-oon Choi; Woo-sung Han, Suwon; Chang-jin Sohn, Kwangmyeong, all of Rep. of Korea

[73] Assignee: Samsung Electronics Co., Ltd., Suwon, Rep. of Korea

[21] Appl. No.: 115,732

[22] Filed: Sep. 2, 1993

[30] Foreign Application Priority Data

Sep. 3, 1992 [KR] Rep. of Korea ............ 92-16059
Feb. 27, 1993 [KR] Rep. of Korea ............ 93-3019
Jul. 15, 1993 [KR] Rep. of Korea ............ 93-13344

[51] Int. Cl.$^6$ ............ G02B 27/44; G03B 27/42; G01B 11/00; G03F 9/00
[52] U.S. Cl. ............ 359/562; 355/53; 356/401; 359/564; 430/5
[58] Field of Search ............ 430/4, 5; 355/53; 359/558, 559, 566, 563, 562, 564; 356/401

[56] References Cited

U.S. PATENT DOCUMENTS

| | | | |
|---|---|---|---|
| 5,184,196 | 2/1993 | Nakagawa et al. | 356/401 |
| 5,200,798 | 4/1993 | Katagiri et al. | 356/401 |
| 5,208,629 | 5/1993 | Matsuo et al. | 355/53 |
| 5,247,329 | 9/1993 | Oshida et al. | 355/53 |
| 5,272,501 | 12/1993 | Nishi et al. | 356/401 |
| 5,320,918 | 6/1994 | Raab et al. | 430/4 |
| 5,331,369 | 7/1994 | Terasawa et al. | 355/53 |

FOREIGN PATENT DOCUMENTS

| | | | |
|---|---|---|---|
| 63-134 | 1/1988 | Japan | 430/5 |
| 4-165352 | 6/1992 | Japan | 430/5 |
| 5-232681 | 9/1993 | Japan | 430/5 |

*Primary Examiner*—Martin Lerner
*Attorney, Agent, or Firm*—Allen LeRoy Limberg; Stephen R. Whitt; Charles R. Donohoe

[57] ABSTRACT

A projection method uses a modified illumination method for a lithography process of semiconductor device, and a projection system and mask use the projection method. An object is exposed by removing the vertical incident component of light passed through a condenser lens. Zero-order diffracted light interferes destructively and the oblique component of ∓ first-order diffracted light, interferes constructively. The obliquely incident component light illuminates a mask having a pattern formed thereon. The vertical incident component of the light is removed by a phase difference of light due to a grating mask or a grating pattern formed on the back surface of the conventional mask. The resolution of a lithography process is improved due to the increased contrast, and the depth of focus is also increased. Thus, patterns for 64 Mb DRAMs can be formed using a conventional projection exposure system.

6 Claims, 10 Drawing Sheets

PROJECTION METHOD AND PROJECTION SYSTEM AND MASK THEREFOR

BACKGROUND OF THE INVENTION

1. Field of the Invention

The present invention relates to a projection method and a projection system and a mask therefor, and more particularly, to a projection method for exposing an object and a projection system and a mask therefor using a modified illumination method that is used for a lithography process of a semiconductor device.

2. Prior Art

A resolution of 0.3 μm and an adequate depth of focus (DOF) are necessary in order to manufacture ULSI chips having an integration of 64M bits or more, and accordingly, many new techniques are under development so as to form patterns of less than one half micron. Examples of these include a method using an excimer laser wherein a short wavelength of light is used, an exposure method using a phase shift mask, and a modified illumination method such as a tilted illumination method.

It is known that the resolution (R) and the DOF of optical projection exposure are proportional to the exposure wavelength (λ) and inversely proportional to the numerical aperture (NA) of a lens, as shown in the following Rayleigh's equation:

$$R = k_1 \frac{\lambda}{NA}$$

$$DOF = k_2 \frac{\lambda}{NA^2}$$

Here, $k_1$ and $k_2$ are process factors, i.e. coherence factors (expressed as σ which is a value obtained by dividing $NA_c$ of an illumination system lens by $NA_0$ of a projection optical system) of an illumination system, and are generally known as being from 0.5 to 0.8. When a coherence factor is not zero, the values of $k_1$ and $k_2$ cannot be known precisely since resolution is largely affected by process ability.

When a pattern having a size below 0.3 μm is to be formed using the current projection exposure method, a DOF larger than 1.6 μm is necessary, due to the large step height of the processed wafer as well as other errors.

In the current stepper, when an exposure is performed by using an i-line, the resolution (R) and DOF are 0.47 μm and 1.46 μm, respectively, since λ is 0.365 μm, and $k_1$ and $k_2$ are 0.65 and 1.0, respectively.

In order to obtain a higher resolution, NA should be larger or λ should be shorter. When using the conventional KrF excimer laser stepper having an NA value of 0.54 (where λ=0.248 μm), the resolution (R) is 0.3 μm while the DOF is 0.85 μm. Accordingly, since the resolution is improved and the DOF is decreased, patterns below 0.3 μm are very difficult to form by applying the current projection exposure method, even though a KrF excimer laser is used.

Additionally, the method wherein a phase shift mask is used is expensive due to the manufacturing costs of the phase shift mask. Also, the mask's manufacture is difficult.

Recently, a method (hereinafter called a "modified illumination method") has been suggested for exposing a resist by a tilted illumination, wherein an illumination system having a filter attached between the fly's eye lens and the condenser lens is used (see "New imaging technique for 64M DRAMs" by N. Shiraishi, S. Hirukuwa, Y. Takeuchi, and N. Magome, Proceedings of SPIE, Vol.1674, Optical/laser Microlithography, p741, 1992).

Figure 1:
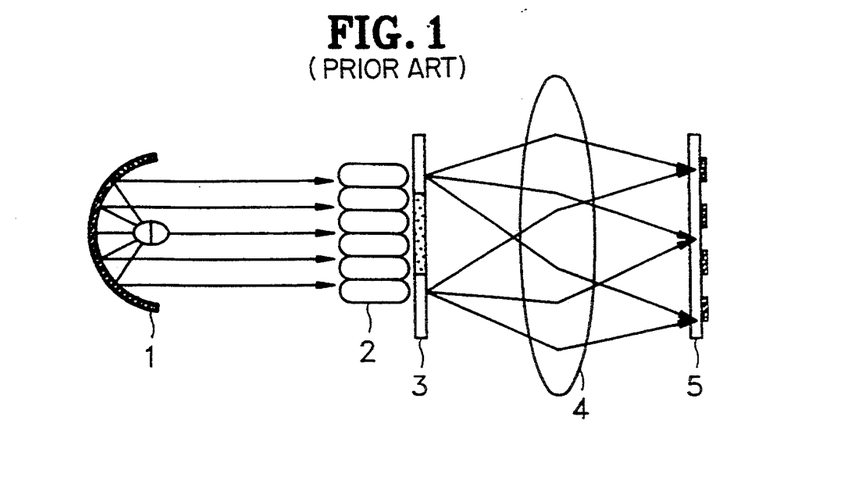
FIG. 1 illustrates a structure of a modified illumination system of the conventional projection exposure system.
Figure 2A:
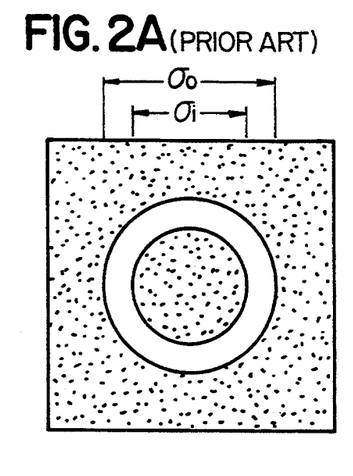
FIGS. 2A and 2B illustrate filter shapes attached to the illumination system of FIG. 1.
Figure 2B:
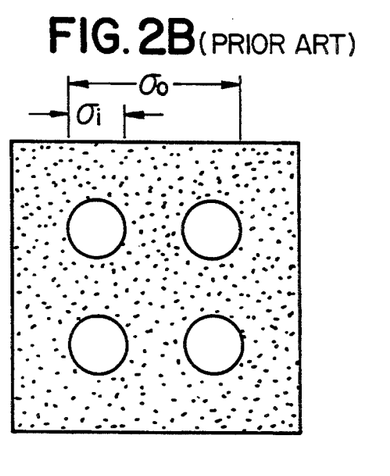

The conventional modified illumination method is explained by referring to FIGS. 1 and 2.

FIG. 1 illustrates a structure of a modified illumination system of the conventional projection exposure system, and FIG. 2 illustrates the shape of a filter attached to the illumination system of FIG. 1.

The conventional modified illumination system is comprised of a conventional illumination apparatus which has a light source 1, a projection lens (not shown), a fly's eye lens 2 and a condenser lens 4, with a filter 3 attached thereto. Filter shapes are shown in FIGS. 2A and 2B. Here, FIG. 2A shows an annular illumination system, while FIG. 2B shows a quadruple illumination system. As shown in FIG. 1, vertical incident components of incident light are blocked by the filter as described above, and only oblique incident components of light illuminates mask 5. This is called a tilted illumination method.

Figure 3:
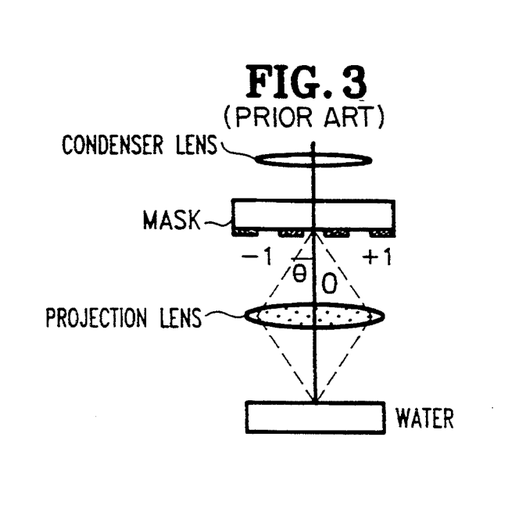
FIG. 3 is a schematic diagram showing a conventional projection exposure method.
Figure 4:
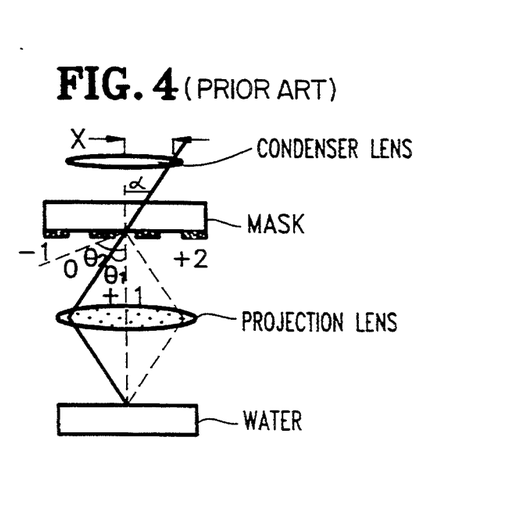
FIG. 4 is a schematic diagram showing an projection exposure method using a conventional tilted illumination method.

Referring to FIGS. 3 and 4, the tilted illumination will be explained in more detail. FIG. 3 is a schematic diagram showing a conventional projection exposure method and FIG. 4 is a schematic diagram showing an projection exposure method using the above tilted illumination method.

Generally, the illumination light from the light source is limited by filter 3 at the exit surface of the fly's eye lens, which coincides with the Fourier transform plane of the mask through the condenser lens. According to the conventional projection exposure method shown in FIG. 3(a), the distribution of illumination light on the Fourier transform plane falls within a circular area. Zero-order diffracted light travels along the optical axis (vertically incident constituent), and +1st- and −1st-order diffracted light travel along the directions of the diffraction angle θ as shown (obliquely incident constituent). All these diffracted beams i.e., the zero-, +1st- and −1-order diffracted light will interfere on the wafer and contribute to image formation.

The diffraction angle θ increases with finer mask patterns. If the sinθ is larger than NA, the +1st- and −1st-order diffracted light will not enter the projection lens, and then only zero-order diffracted light enters the projection lens to reach the surface of wafer, which then results in no interference. At this time, the minimum resolution is defined as:

$$R = \frac{\lambda}{2NA}$$

Meanwhile, since filter 3 is disposed in a position eccentric of the optical axis, the illumination light transmitted through a filter illuminates the mask having a specific obliquely incident angle, in the above obliquely incident illumination. Obliquely incident angle α is defined by a distance (x) between the optical axis and transmissive portion of the filter and by the focus length (f) of the condenser lens.

f sin (α)=x

The illumination light is diffracted by the mask pattern. The zero-order light is diffracted by angle θ with respect to the optical axis, and the angles between the path of +1st- and −1st-order diffracted light ($\theta 1$ and $\theta 2$, respectively) and the optical axis have the following relationships:

$$\sin(\theta 1) + \sin(\alpha) = \lambda/Pr$$

$$\sin(\theta 2) - \sin(\alpha) = \lambda/Pr$$

wherein, Pr is the line-to-space pitch of the mask.

Higher-order diffracted light travels other paths. Since the pitch of the pattern is fine and the $\sin(\theta 2)$ is larger than the NA of the projection lens in the mask side, −1st-order, and higher, diffracted light will not enter the projection lens. As a result, only zero-order and +1st-order diffracted light will interfere on the wafer surface and contribute to the image formation. The contrast of the image is approximately 90% when the mask patterns are lines and spaces with a duty of 1:1.

Here, the resolution (R) is defined as follows:

$$R = \frac{\lambda}{2(NA + \sin(\theta 1))}$$

Given a 5× projective magnification and a $\sin(\theta 1)$ of NA/2, the resolution limit on the wafer side is:

$$R = \frac{\lambda}{2(NA + NA/2)}$$
$$= \frac{\lambda}{3NA}$$

The resolution limit is 1.5 times higher than that of a conventional projection exposure method. The DOF is also improved by the obliquely incident illumination method as described above.

In the above conventional oblique incident illumination method, given filter shapes as in FIGS. 2A or 2B, the area through which the light passes is much smaller than the area where light is blocked. In the case of FIG. 2A, the ratio of the light transmission is calculated by the expression $(\sigma_D^2 - \sigma_i^2)/\sigma_D 2$, and in general, $\sigma_i = 2\sigma_D/3$ is known as the most preferable value wherein a transmission ratio is 5/9 and the exposure time is duplicated.

Referring to the case shown in FIG. 2B, the transmission ratio is calculated by the expression of $4\sigma_i^2/\sigma_D^2$ (where $\sigma_i = \sigma_D/4$), and the exposure ratio is 1/4, which quadruples the exposure time and the throughput is considerably reduced.

That is, since the conventional modified illumination system is a system comprised of the conventional illumination system and a filter attached thereto wherein the light transmitted to the illumination system is partially blocked, the exposure amount during the modified illumination is too small. Therefore, the exposure time becomes too long while error in the exposure system is generated, which results in the deterioration of uniformity.

SUMMARY OF THE INVENTION

Accordingly, it is an object of the present invention to provide an improved projection method which can enhance the efficiency of the projection system and form a fine pattern below 0.3 μm using the conventional projection system.

It is another object of the present invention to provide a projection exposure system which is suitable for performing the above projection exposure method.

It is a further object of the present invention to provide a mask which is to be attached to the above projection exposure system.

To accomplish the above object, the present invention provides a projection method for exposing an object using a mask, comprising the steps of: removing a vertical component of a light illuminated from a light source to thereby generate an oblique incident light; and exposing the object by irradiating the oblique incident light on the mask. The above oblique incident light is an odd-number-order diffracted light, that is, ±1st diffracted light.

According to a first embodiment of the present invention, the oblique incident light generating step is performed by forming a grating pattern in the upper part of the mask. The above grating pattern may be formed all over the upper part of the mask so as to remove all the vertical incident components of the light which illuminates the mask. Also, the grating pattern may be formed in a portion of the upper part of the mask in order to partially remove the vertical incident components of the light which illuminates the mask.

The pitch (or cycle) of the above grating pattern is preferably $\lambda/\sin[0.2 \sin^{-1}(NA_i)]$, to $\lambda/\sin[0.8 \sin^{-1}(NA_i)]$, wherein $\lambda$ is the wavelength of the used light and $NA_i$ is the numerical aperture of the incident side of the projection exposure system.

According to a second embodiment of the present invention, the step of generating the oblique incident light is performed by using a grating mask wherein a grating pattern is formed on a transparent substrate. The above grating pattern may be formed all over or part of the above substrate.

Also, the above object of the present invention can be achieved by a projection method for exposing an object using a mask, comprising the steps of: generating an oblique incident light from a light between said mask and a light source by interfering zero-order diffracted light; and exposing said object by illuminating said oblique incident light on said mask.

To accomplish another object of the present invention described above, there is provided a projection exposure system for exposing an object comprises a light source; first means for irradiating a light from said light source onto a mask; second means for generating an oblique incident light by removing a vertical component of said light between said light source and said mask. The first means comprises a condenser lens and the second means is provided between the condenser lens and the mask.

According to an embodiment of the present invention, the second means is a phase shift chromeless mask having a grating pattern comprised of regular patterns formed thereon by which zero-order diffracted light interferes and is removed by a phase difference of light.

According to another embodiment of the present invention, the second means is a grating pattern comprised of regular patterns which is formed on the back surface of the mask, whereby zero-order diffracted light interferes and is removed by a phase difference of light.

To achieve another object of the present invention, there is provided a mask comprising: a transparent substrate; and a grating pattern regularly formed on said substrate, whereby a light interferes by a phase difference of light so that zero-order diffracted light interferes to thereby remove a vertical incident component of light, and enhance the oblique incident component of light of ± first-order diffracted light.

According to an embodiment of the present invention, the grating pattern is formed to have a phase difference alternately in a checkerboard type.

According to another embodiment of the present invention, the mask comprises a first grating pattern arrayed on one surface of said substrate at regular intervals in the X-axis direction. Preferably, the mask further comprises a second grating pattern formed on the other surface of the substrate. The second grating pattern has the same interval as the first grating pattern and the second grating patten is formed in the Y-axis direction, perpendicular to the X-direction.

Additionally, the present invention provides a mask comprises: a first transparent substrate; a pattern formed on said transparent substrate so as to define an exposure area of an object; a second transparent substrate attached to the back surface of first substrate on which said pattern is not formed, and having a grating pattern formed thereon at regular intervals, whereby a light interferes by a phase difference of light so that even-numbered-order diffracted light is removed while odd-numbered-order diffracted light is enhanced.

Adhesive supporting band means for attaching and supporting the second transparent substrate to the first transparent substrate may be provided between said first and second substrate. The first and second transparent substrate may have the same size, or the second transparent substrate may be larger than the first transparent substrate.

Further, the present invention provides a mask which comprises: a transparent substrate; a pattern formed on one surface of said transparent substrate for defining an exposure region of an object; a grating pattern formed on the other surface of said transparent substrate at regular intervals, whereby a light interferes by a phase difference of light so that even-numbered-order diffracted light is removed while odd-numbered-order diffracted light is enhanced. The grating pattern may be a pattern obtained by patterning the back surface of said transparent substrate. The grating pattern may be comprised of a material different from the material of said transparent substrate. For example, the grating pattern may be formed by patterning a pellicle.

When an exposure process is performed by a projection method for exposing an object of the present invention, vertical components of the light are removed by a mutual interference, and then only oblique components remain. That is, zero-order diffracted light and second-order diffracted light are removed by the interference, and first- and third-order (and higher odd-numbered-orders) diffracted light is enhanced. Diffracted light higher than the third order scarcely exist.

Since most of the transmitted light becomes first-order light, the transmission efficiency is enhanced remarkably, which results in the improvement of resolution and assuring a DOF to the extent of 2.2 μm.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

The present invention will be described below in more details with reference to the attached drawings.

Figure 5:
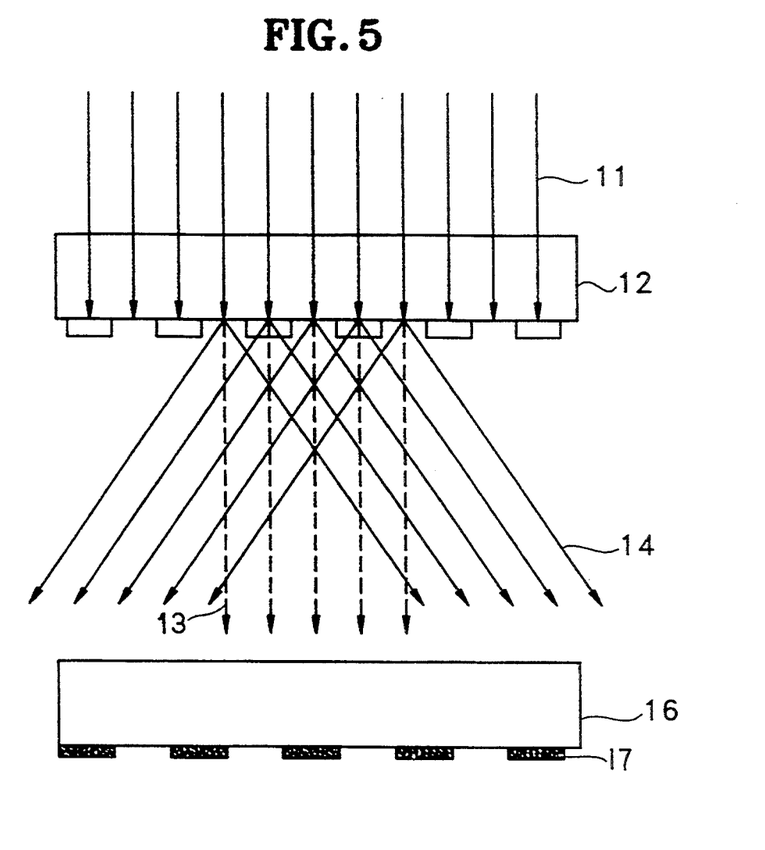
FIG. 5 illustrates a structure of an illumination system which is used for the modified illumination method of the present invention.

FIG. 5 illustrates a structure of an illumination system which is used for the modified illumination method of the present invention.

A chromeless phase shift mask 12 (hereinafter called a "grating mask"), i.e., a dummy mask having thereon patterns at regular intervals (hereinafter called a "grating pattern") that is not resolved on the wafer, is provided above a conventional chrome mask 16 having a pattern 17 formed thereon for pattern-imaging on the wafer in the modified illumination system (projection exposure system) shown in FIG. 5. The grating mask is a chromeless phase shift mask which generates diffracted light of an odd-numbered order. Vertical component 13 of incident light 11 by a grating mask 12 interferes destructively and an obliquely incident component 14 interferes constructively and illuminates the wafer through a conventional chromium mask 16. Accordingly, the use of the above grating mask may accomplish the same effect as in a modified illumination method without attaching a filter for generating obliquely incident light as in the conventional modified illumination method. The required exposure amount is reduced since a portion of the light is blocked by a filter in the conventional modified illumination method. However, in the present invention, the optical transmission efficiency is improved since the portion which blocks the light is small and exposure is done by selectively using the obliquely incident component by means of the grating mask.

When the resist exposing process is performed by the modified illumination method of the present invention using the above grating mask, a resolution of 0.3 μm or below can be achieved and the exposure time is reduced remarkably as compared with that of a conventional modified illumination method using the obliquely incident light.

Figure 6A:
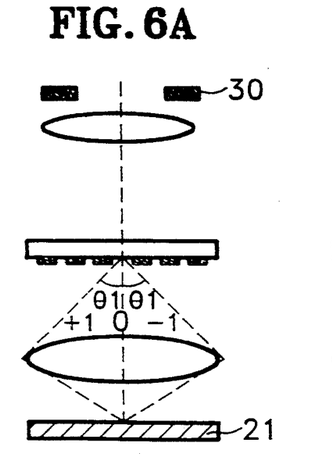
FIGS. 6A to 6C are schematic views illustrating an optical path of a projection exposure system, for comparing and explaining the modified illumination method of the present invention, a conventional illumination method and a conventional modified illumination method.
Figure 6B:
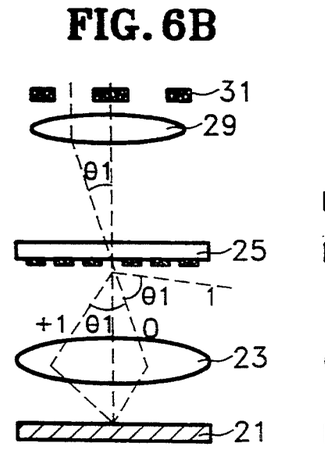
Figure 6C:
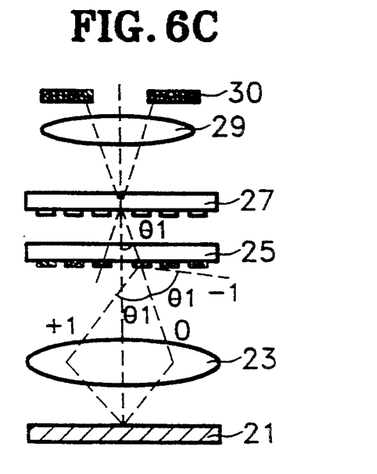

FIG. 6A to 6C are schematic views illustrating an optical path of projection exposure system in order to compare and explain the modified illumination method of the present invention, a conventional illumination method and a conventional modified illumination method. FIG. 6A illustrates a conventional illumination method, FIG. 6B illustrates a conventional modified illumination method, and FIG. 6C shows the modified illumination method of the present invention. In the above figures, reference numeral 21 indicates a semiconductor wafer which is the object of exposure, reference numeral 23 indicates a projection exposure lens, reference numeral 25 indicates a mask having a pattern thereon, reference numeral 27 indicates a grating mask, reference numeral 29 indicates a condenser lens, reference numeral 30 indicates a filter through which the light from the light source passes, and reference numeral 31 indicates a filter used for the modified illumination method, as shown in FIG. 2B. The illumination methods shown in FIG. 6A and FIG. 6B are the same as described above.

The projection exposure system of the present invention as shown in the above comprises a grating mask 27 for removing a vertical incident component of the light between the light source and mask 25.

The principle of enhancing the resolution in accordance with the use of the above grating mask 27 can be explained as follows.

Generally, in the case of a conventional alternating phase shifting mask, a phase shifter is alternately formed in a mask pattern so as to change a pattern cycle into 4R, and a small a value is used in order to use the vertical incident light. In such a case, zero-order diffracted light interferes by the two adjacent patterns so that it is removed. In the meantime, ±1st-order diffracted light contributes to the image formation through the lens. Accordingly, the resolution becomes $R=\lambda/4NA$. When a conventional phase shift mask is used, the ±1st-order diffracted light is enhanced while zero-order diffracted light interferes and is thus removed, thereby to maintain a high contrast. However, if obliquely incident light is used for a conventional phase shift mask, offset interference does not occur, due to the incorrect phase difference. Then, the contrast is lowered.

In the modified illumination method of the present invention, the grating mask 27 is made in such a way that zero-order diffracted light interferes destructively and first-order diffracted light interferes constructively. The above grating mask is used so that the obliquely incident having a predetermined angle illuminates the patterns.

The resolution of the modified illumination method of the present invention is a function of obliquely incident angle θ of light with respect to the mask, as in the obliquely incident method of the conventional modified illumination method. Assuming that the pitch of the grating pattern of the grating mask is $P_g$, the angle of the obliquely incident light and the maximum resolution are expressed:

$$\theta = \sin^{-1}(\lambda/P_g)$$

and $$R = \lambda/2NA(1 + \sin\theta_i/NA)$$
$$= \lambda/2NA(1 + \alpha)$$

wherein $\alpha = \sin \theta_i/NA$.

In the conventional modified illumination method, α cannot become equal to σ or more. However, α is not set in the illumination method of the present invention, and could be adjusted tip to "1" by adjusting the size of the grating.

The above cycle of grating is determined as follows.

The maximum angle θ which can be acceptable to an exposure system can be expressed by the equation $\theta = \sin^{-1}(NA_i)$, wherein $NA_i$ is the numerical aperture of the incident side, and an angle of 0.2~0.8 times θ is necessary for excellent resolution.

Accordingly, the cycle of pattern is preferably between $\lambda/\sin [0.2 \sin^{-1}(NA_i)]$ and $\lambda/\sin [0.8 \sin^{-1}(NA_i)]$, wherein λ represents the wavelength of the used light and $NA_i$ represents the numerical aperture of the incident side of the exposure system.

Since the cycle of pattern depends on the sensitivity and resolution of the photoresist to be used, optimization is necessary for achieving maximum effect. However, in general, the necessary cycle P of the mask phase is:

$$P = \lambda/\sin[0.5\sin^{-1}(NA_i)]$$
$$= \lambda/\sin\beta$$

wherein $\beta = 0.5 \sin^{-1}(NA_i)$, λ represents the wavelength of the used light, $NA_i$ represents the numerical aperture of the incident side of exposure system, and under the assumption that 0.5 times is the optimum.

The grating mask of the present invention is explained in more detail by the following embodiment and referring to the attached drawings.

Figure 7A:
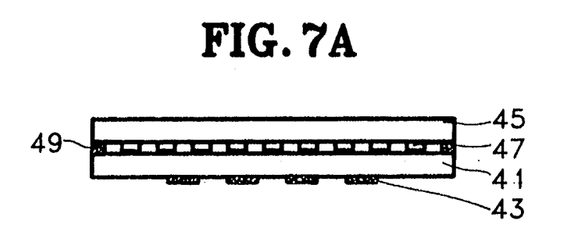
FIGS. 7A and 7B are sectional views for illustrating the grating masks of the present invention attached to a conventional mask having a pattern formed thereon.
Figure 7B:
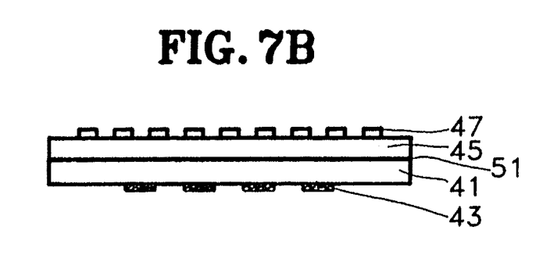
Figure 8A:
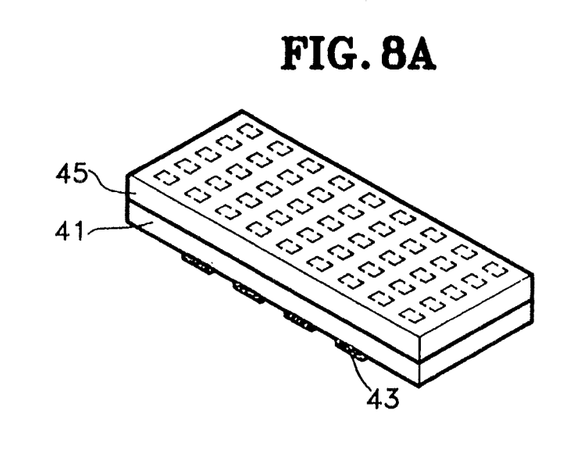
FIGS. 8A and 8B are perspective views for illustrating the conventional masks to which the grating mask of the present invention shown in FIGS. 7A and 7B, is attached.
Figure 8B:
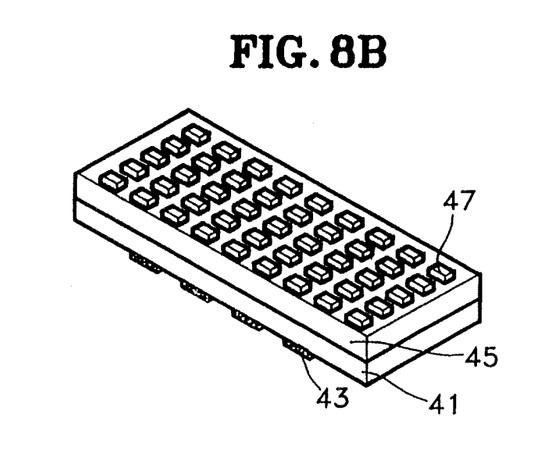

FIG. 7A and FIG. 7B are sectional views for illustrating the grating masks of the present invention attached to a conventional mask having a pattern formed thereon, while FIG. 8A and FIG. 8B are perspective views for illustrating the conventional masks to which the grating mask of the present invention shown in FIG. 7A and FIG. 7B is attached.

Referring to FIGS. 7A, 7B, 8A and 8B, reference numeral 41 represents a conventional mask substrate, reference numeral 43 represents a pattern for defining the exposure region which is comprised of chrome, reference numeral 45 represents a grating mask substrate, reference numeral 47 represents a grating pattern, reference numeral 49 represents an adhesive support band for the grating mask, and reference numeral 51 represents double-sided adhesive tape that secures the grating mask and the conventional mask.

The grating mask comprised of a grating mask substrate 45 and grating pattern 47 formed thereon, is obtained by forming a grating pattern 47 on grating mask substrate 45 comprised of quartz, soda lime glass, or boron silicate glass. Grating pattern 47 is formed by a conventional method for forming a mask pattern. Grating pattern 47 can be formed by using a photoresist or by patterning using spin-on glass, or by patterning the back side (where the pattern is not formed) of grating mask substrate 45 which is comprised of quartz. At this time, the thickness (t) of grating pattern 47 is determined so that the light transmitting the grating mask has 180° of phase difference considering the used wavelength, mask material, and the pattern material. Thus, the light path difference D can be calculated by the following formula:

$$D = 2\pi t(n-1)\lambda$$

wherein n is a refractive index of the pattern material and λ represents the wavelength of the used light.

Since the light path difference in order to achieve an interference is equal to π, the thickness (t) of the above grating pattern can be determined as follows:

$$t = \lambda/2(n-1)$$

The above grating pattern forms a regular cycle, as described above.

FIG. 7A illustrates a grating mask attached to a conventional mask wherein the surface of the grating mask on which grating pattern 47 is formed faces back surface of a conventional mask. FIG. 7B illustrates a grating mask attached to a conventional mask wherein the surface of the grating mask on which grating pattern 47 is not formed faces the back surface of a conventional mask substrate 41. Thus, the grating mask of the present invention can be attached to a conventional mask by using either of the methods shown in FIGS. 7A and 7B.

Such an attachment of grating mask substrate 45 to conventional mask substrate 41 may be performed by using adhesives such as an epoxy resin, a cement, a silicon caulking or double-sided adhesive tape. The attachment between grating mask substrate 45 and conventional mask substrate 41 may be performed by a melting-adhering method or a clamping method using a quartz clamp.

Further, the space between grating mask substrate 45 and conventional mask substrate 41 is preferably 1.0 μm or more in order to prevent the two masks from abrading each other during the attachment step. In such a case, a thick adhesive tape or pellicle frame can be used as adhesive supporting band 49, as shown in FIG. 7A. At this time, the space between grating mask substrate 45 and conventional mask substrate 41 may even be up into the tens of millimeters.

Figure 9A:
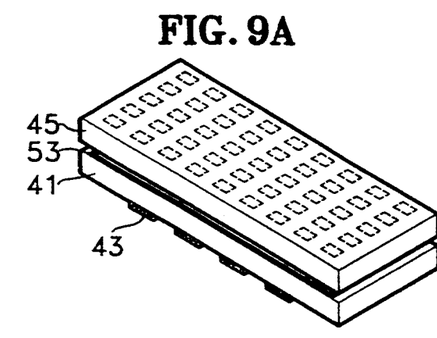
FIGS. 9A and 9B are perspective views showing another embodiment wherein the grating mask of the present invention is attached to a conventional mask.
Figure 9B:
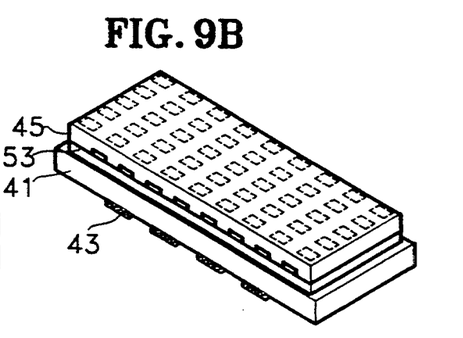

FIG. 9A and FIG. 9B are perspective views showing another embodiment wherein the grating mask of the present invention is attached to a conventional mask. Reference numeral 53 represents pellicle frame, with all other reference numerals having the same representations as in FIG. 7A and FIG. 7B. Here, grating mask substrate 45 is attached to a conventional mask substrate 41 by an adhesive supporting band 49, as shown in FIG. 7A. In FIGS. 9A and 9B, pellicle frame 53 is used as the adhesive supporting band of FIG. 7A. FIG. 9A illustrates an embodiment wherein after attaching pellicle frame 53 to conventional mask 41, grating mask 45 is then attached to pellicle frame 53. The mask shown in FIG. 9B is the same as that shown FIG. 9A, except that grating mask substrate 45 has been cut to the same size as that of pellicle frame 53 and attached to pellicle frame 53.

A new pellicle is not necessary for pellicle frame 53, because an old pellicle frame from which the frame is detached may be used. Thus, abrasion between the two masks can be prevented by using pellicle frame 53 as a supporting band of grating mask substrate 45 and, to conserve waste, the used frame can be reused.

Figure 10A:
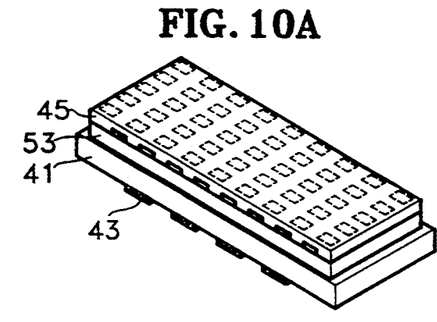
FIGS. 10A and 10B are perspective views showing still another embodiment wherein the grating mask of the present invention is attached to a conventional mask.
Figure 10B:
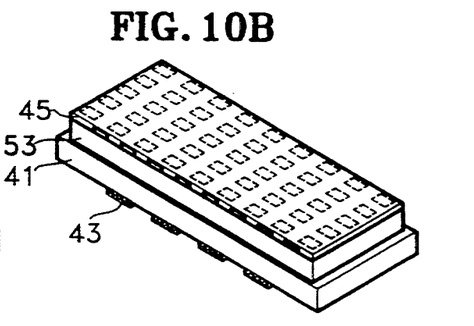

FIGS. 10A and 10B are perspective views showing still another embodiment wherein the grating mask of the present invention is attached to a conventional mask. Here, the reference numerals have the same representations as in FIG. 8B.

The grating mask shown in FIG. 10A is the same as that of FIG. 9A, except that it is thinner. The thinning of grating mask substrate 45 as above may be performed by forming grating pattern 47 after repeated lapping and polishing the conventional transparent substrate so as to become whetted, or by grinding the back surface of the transparent substrate through lapping and polishing after forming grating pattern 47 on a grating mask substrate 45 while protecting the portion where grating pattern 47 has been formed by a polymer coating process.

The grating mask as shown in FIG. 10B is the same as that of FIG. 10A, except that after forming grating pattern 47 on grating mask substrate 45 which is comprised of quartz, the back portion of grating mask substrate 45 has been cut and then grating mask substrate 45 has been attached to conventional mask substrate 41.

Figure 11:
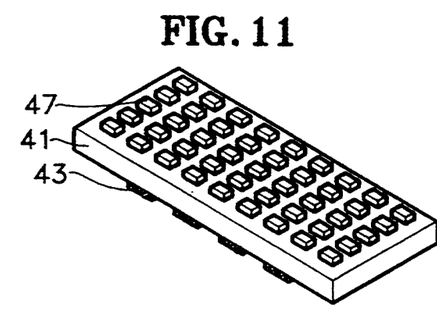
FIG. 11 illustrates still another embodiment of the mask of the present invention.

FIG. 11 illustrates still another embodiment of the mask of the present invention. Here, the mask has been obtained by forming grating pattern 47 on the back surface of a conventional mask substrate 41 having a conventional chrome pattern 43 formed thereon. Grating pattern 47 can be formed by a conventional photo process when a photoresist is used. When grating pattern 47 is formed by using a material such as SOG or by etching the substrate itself, an etching step on the mask substrate must be performed via a photolithography process. In such a case, mask etching facilities are of course necessary.

Figure 12:
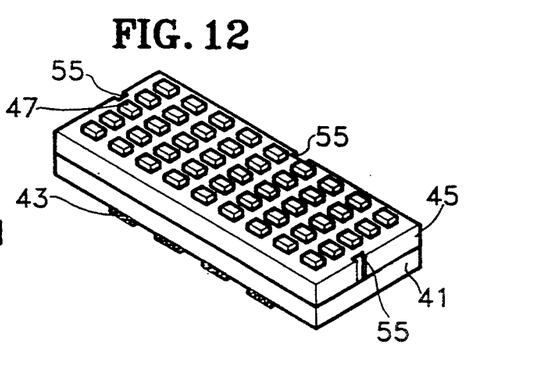
FIG. 12 shows still another embodiment of grating mask of the present invention.

FIG. 12 shows still another embodiment of grating mask of the present invention. The grating mask shown in FIG. 12 is the same as that shown in FIG. SB, except that the grooves 55 through which the mask alignment light passes are formed in the edge portions of grating mask substrate 45.

When the exposure is performed by interposing a grating mask on a conventional mask as shown in FIG. 8B, the light intensity may be lowered or the light can be reflected from the interface of the masks, since the mask alignment light has to pass through grating mask substrate 45 and through conventional mask substrate 41. In such a case, errors occur because the light cannot be sensed. Therefore, in order to prevent such a problem, groove 55 is preferably formed by cutting the edge portion of grating mask substrate 45 through which the mask alignment light passes. This groove may be formed using an ultrasonic cutter or a dicing machine.

FIG. 13 illustrates views for explaining the mask shown in FIG. 12 in more detail. Referring to FIG. 13, "A" is a plan view of the grating mask of FIG. 12, "B" is a sectional view of the above grating mask-taken along the line X-X', and "C" is a plan view of the conventional mask of FIG. 11, "D" is a sectional view of the above conventional mask taken along the line Y-Y', "E" is a plan view of an embodiment of the mask according to the present invention wherein the grating mask A and the conventional mask B are attached so that the surface of grating mask substrate 45 on which grating pattern 47 is not formed faces the back surface of the conventional mask substrate 41, and "F" is a sectional view of the grating mask E taken along the line Z-Z'.

Figure 13A:
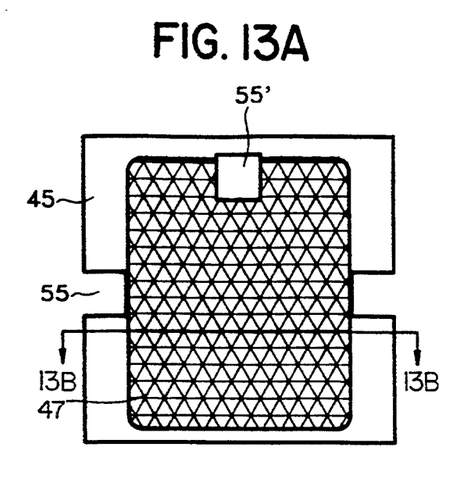
FIG. 13 illustrates views for explaining the mask shown in FIG. 12 in more detail.
Figure 13B:
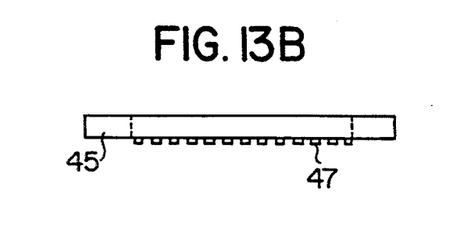
Figure 13C:
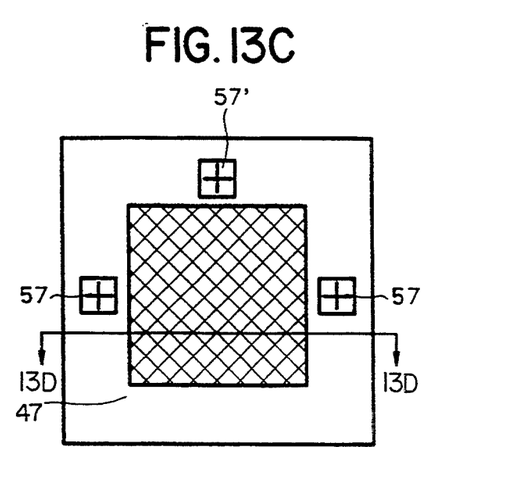
Figure 13D:
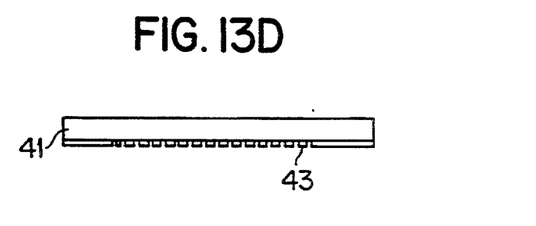
Figure 13E:
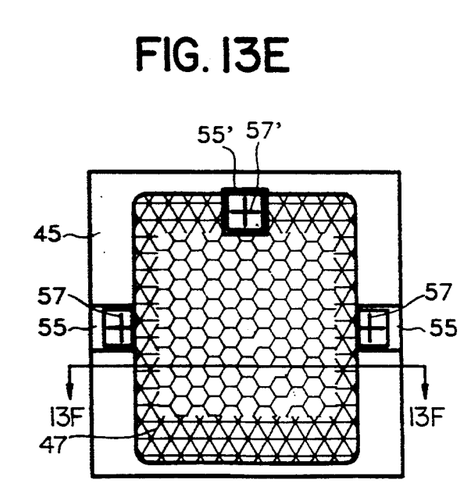
Figure 13F:
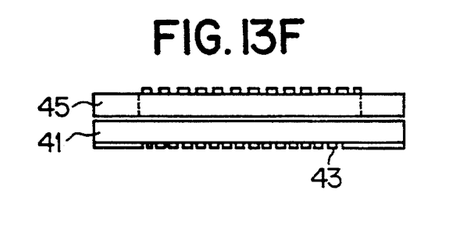

In FIG. 13C, reference numerals 57 and 57' represent the alignment marks. As can be seen in the figure, a groove 55 is formed in the portion of grating mask substrate 45 which corresponds to the portion wherein the alignment mark is formed. Since the portion that corresponds to alignment mark 57' exists in the grating-pattern-formed portion, an aperture 55' must be formed in the corresponding portion of grating mask substrate 45 to alignment mark 57'.

Figure 14A:
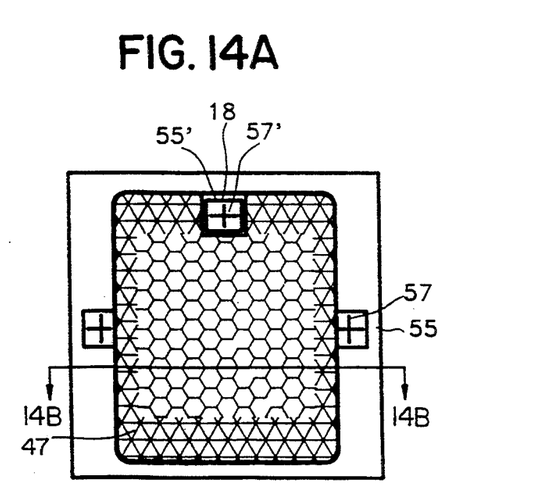
FIG. 14 illustrates still another embodiment of the grating mask of the present invention.
Figure 14B:
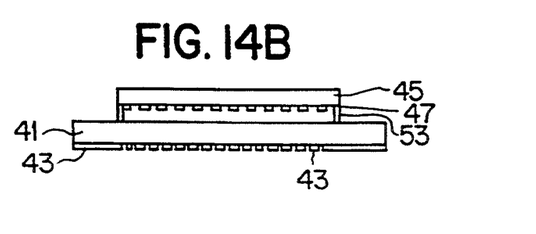

FIG. 14 illustrates still another embodiment of the grating mask of the present invention. The mask shown in FIG. 14 is the same as that of FIG. 13E, except that grating mask substrate as shown in FIG. 9B is attached so that the surface on which grating pattern 47 is formed faces the back surface of conventional mask substrate 41. Referring to FIG. 14, "A" is a plan view of the above mask, while "B" is a sectional view of A taken along the line Z-Z'.

Figure 15:
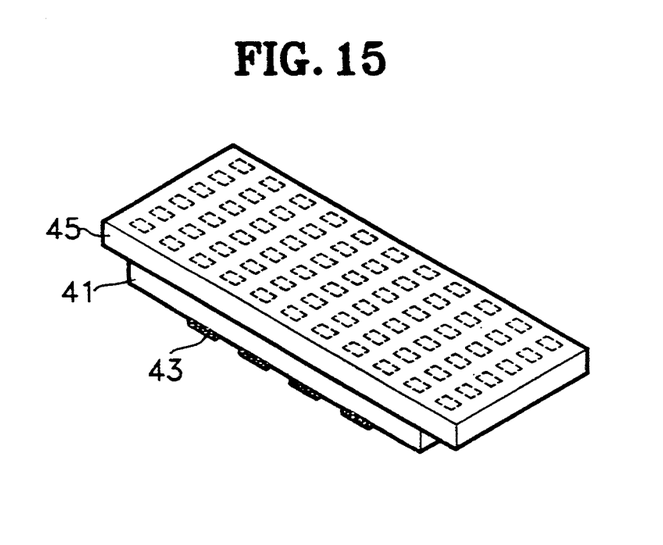
FIG. 15 illustrates still another embodiment of a mask of the present invention.

FIG. 15 illustrates still another embodiment of a mask of the present invention. The mask is shown in FIG. 15 is the same as that of 7A, except that grating mask substrate 45 is larger than conventional mask substrate 41. When the grating mask substrate is larger than the conventional mask substrate, the manual operation of the exposure system is easy.

Figure 16:
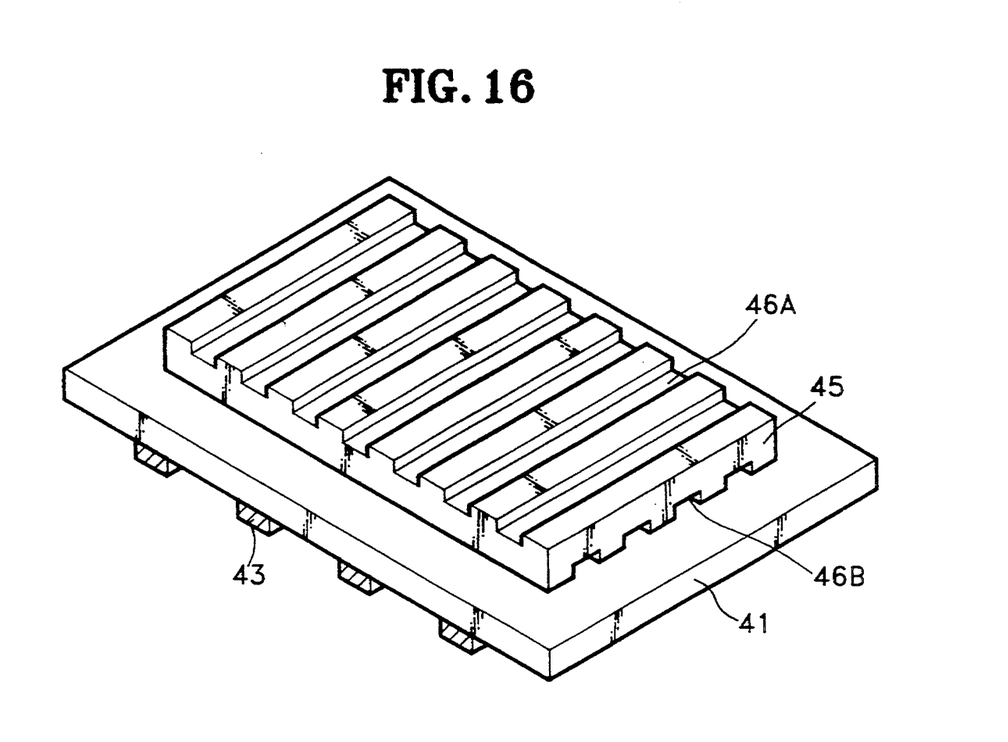
FIG. 16 is a perspective view showing still another embodiment of the mask wherein the grating mask of the present invention is attached to a conventional mask.

FIG. 16 is a perspective view showing still another embodiment of the mask wherein the grating mask of the present invention is attached to a conventional mask. Referring FIG. 16, reference numeral 41 is a conventional mask substrate, reference numeral 43 is a pattern for defining the exposure area to be comprised of chrome, reference numeral 45 is a grating mask substrate, reference numeral 46A is a first grating pattern formed in the X-axis direction, and reference numeral 46B is a second grating pattern which is formed on another surface of grating mask substrate 45 in the Y-axis direction and perpendicular to the above X-axis direction.

The above first and second grating pattern 46 and 50 are formed on both surfaces of the same grating mask substrate 40 in the present embodiment. However, two grating masks with the same grating pattern can be used in combination with each other so as to meet perpendicularly.

A method for manufacturing a mask of the present invention will be explained in more detail with respect to the following embodiments.

Embodiment 1

FIGS. 17A to 17D are diagrams for illustrating a first embodiment of a method for manufacturing a mask of the present invention.

Figure 17A:
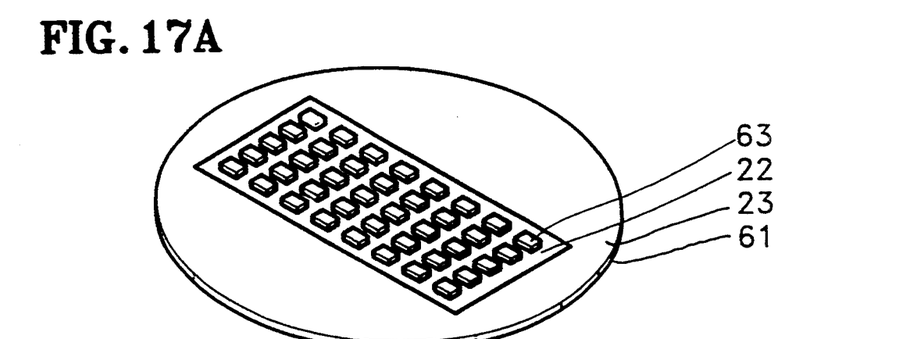
FIGS. 17A to 17D are diagrams for illustrating a first embodiment of a method for manufacturing a mask of the present invention.

FIG. 17A illustrates a step of forming a grating pattern 63. A photoresist film is formed on a quartz wafer 61 whose diameter is 6" and whose thickness is $0.1 \sim 1$ mm, by coating a photoresist to a thickness of $0.1 \sim 1$ $\mu$m. Then, a photoresist pattern (not shown) for forming grating pattern 63 is formed by patterning using NSR-1505i7A (Nikon trade name), and then a checkerboard type grating pattern 63 as shown, is formed by etching the quartz wafer 61. After a cleaning process, the remaining photoresist pattern is stripped away.

Figure 17B:
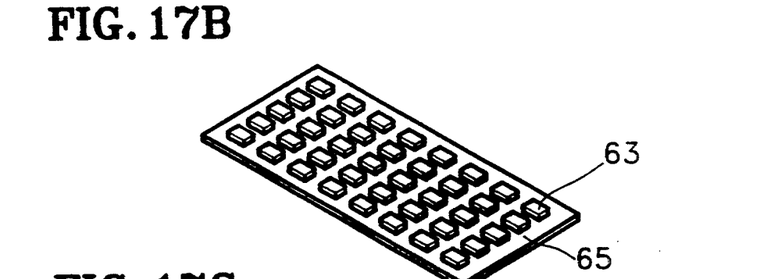

FIG. 17B illustrates a step of cutting a quartz wafer to thereby form a grating mask. Quartz wafer 61 on which grating pattern 63 has been formed is cut using a dicing machine or a diamond knife so as to be fit to the size of a pellicle frame, and then a grating mask substrate 65 on which grating pattern 63 is formed is obtained. Then, cleaning is performed.

Figure 17C:
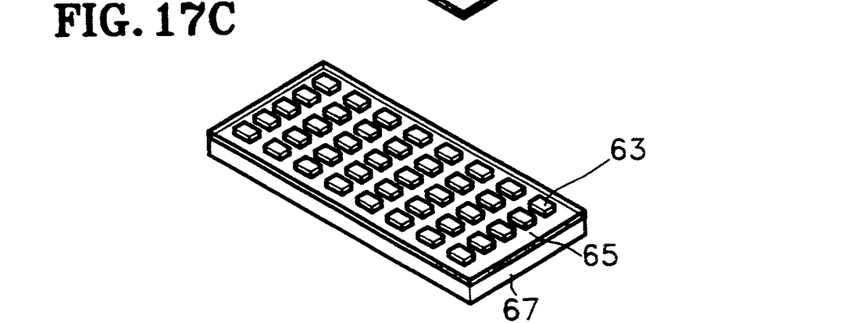

FIG. 17C illustrates a step of attaching grating mask substrate 65, obtained in the above step, to a pellicle frame 67. Pellicle frame 67 having a size of 98 mm $\times$ 120 mm $\times$ 4 mm is used. After separating pellicle frame 67 from a damaged pellicle, double-sided adhesive tape is coated on the upper and lower rim of pellicle frame 67, and then grating mask substrate 65 is glued to pellicle frame 67 in a clean room.

Figure 17D:
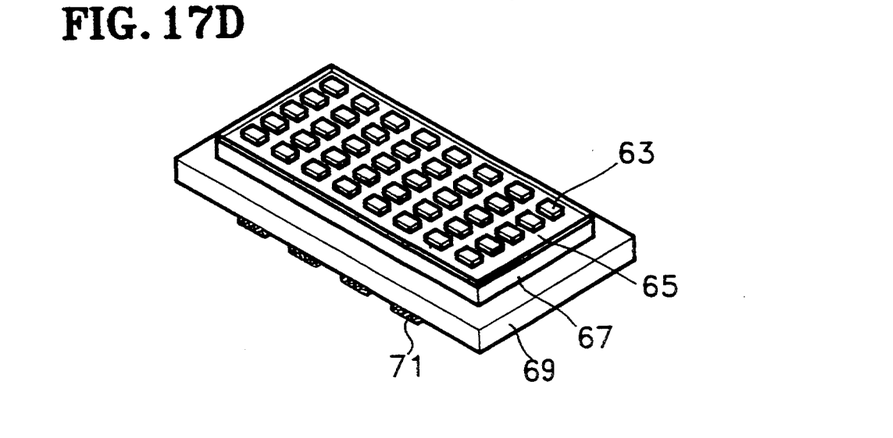

FIG. 17D illustrates a step of attaching grating mask substrate 65 to a conventional mask substrate on which a conventional chrome pattern 71 is formed. After grating mask substrate 65 is glued to the one side of pellicle frame 67, a conventional mask substrate whose size is $5'' \times 5'' \times 0.09''$ is attached so that the surface of grating mask substrate 65 on which grating pattern 63 is not formed faces the back surface of conventional mask substrate 69 (continuously in the clean room), to thereby obtain a mask of the present invention.

Embodiment 2

Figure 18:
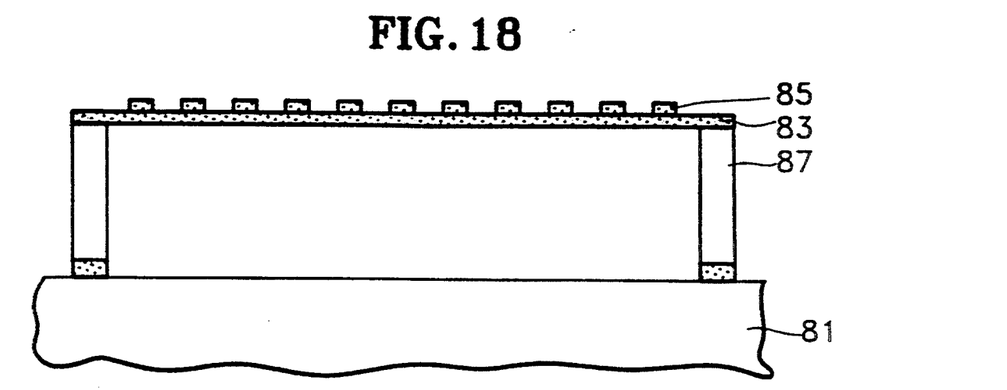
FIG. 18 is a schematic view showing a second embodiment of the present invention.

FIG. 18 is a schematic view showing a second embodiment of the present invention.

After coating a pellicle manufacturing material such as nitro-cellulose to a thickness of $2 \sim 3$ $\mu$m on a grating mask having the grating pattern obtained in Embodiment 1, a mask film 83 on which a grating pattern 85 has been imaged is obtained. Thereafter, after separating mask film 83 from the grating mask, mask film having the grating pattern (which has a reverse image to that of the grating mask of Embodiment 1) is attached to a conventional mask substrate 81 using the same pellicle frame 87 as in Embodiment 1, in the same manner as in Embodiment 1.

Embodiment 3

A photoresist is coated to a thickness of approximately $0.1 \sim 1$ $\mu$m on the back surface of quartz mask substrate on which a conventional chrome pattern is formed, to thereby form a photoresist pattern. Thereafter, a grating pattern is transcribed by using an electron beam exposure system. Then, processes such as a development, a quartz etching, a photoresist pattern stripping are performed to obtain a mask of the present invention having a grating pattern formed on one surface of the mask substrate and a conventional chrome pattern formed on another surface of the mask substrate, as shown in FIG. 10.

Embodiment 4

A grating mask is obtained by forming a grating pattern on quartz grating mask substrate whose size is 5"×5"×0.09" as described in. Embodiment 1 or 3. Then, the grating mask is attached to a same-sized conventional mask substrate using a pellicle frame in the same manner as in Embodiment 1, to thereby obtain a mask of the present invention as shown in FIG. 9A.

Embodiment 5

A mask of the present invention is obtained in the same manner as in Embodiment 4, except that lapping and polishing processes are performed on the back surface of the grating mask substrate so as to grind the thickness to 0.09"~0.03".

Embodiment 6

FIGS. 19A to 19D are perspective views for illustrating a sixth embodiment for manufacturing a grating mask of the present invention.

Figure 19A:
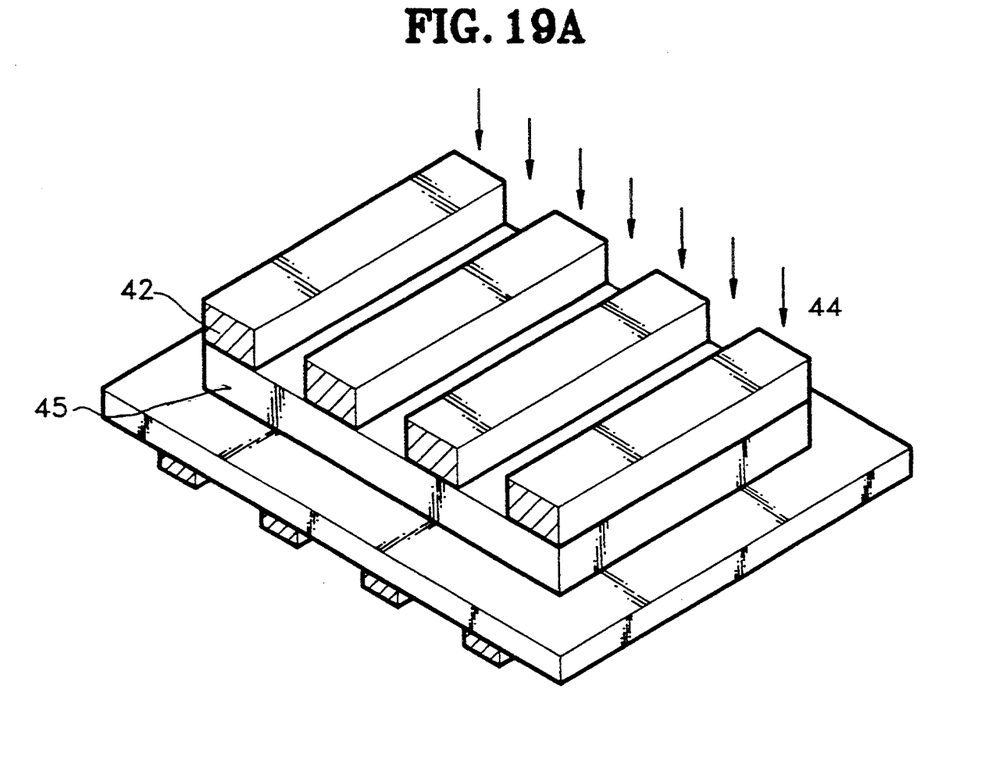
FIGS. 19A to 19D are perspective views for illustrating a sixth embodiment for manufacturing a grating mask of the present invention.

FIG. 19A illustrates a step of forming a first photoresist pattern. A photoresist layer (not shown) is formed by coating a photoresist on a quartz mask substrate 45. The photoresist film is exposed on mask substrate 45 by exposing to a light 44, which then is developed and forms a first photoresist pattern 42 for forming a first grating pattern in the X-axis direction.

Figure 19B:
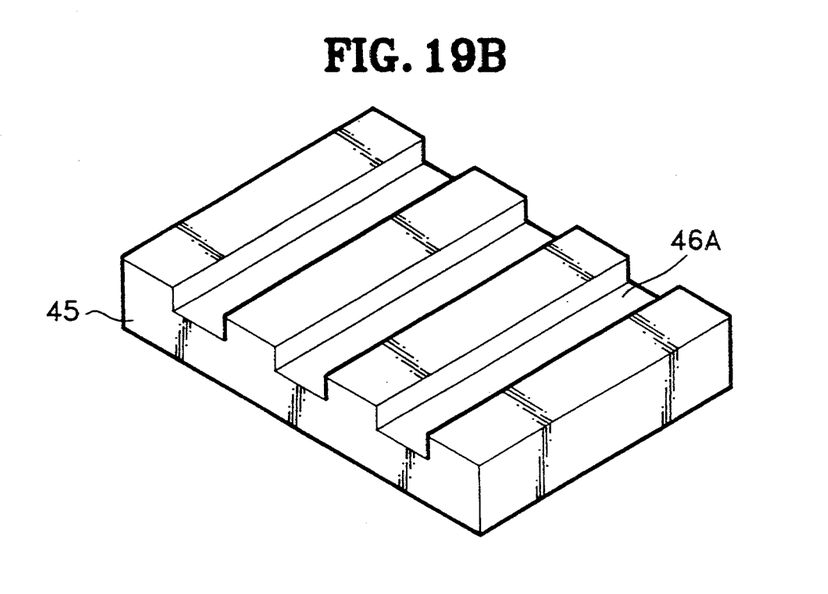

FIG. 19B illustrates a step of forming a first grating pattern in the X-axis direction. First grating pattern 46A which is arrayed in the X-axis direction is formed by etching mask substrate 45 using first photoresist pattern 42 as an etching mask.

Figure 19C:
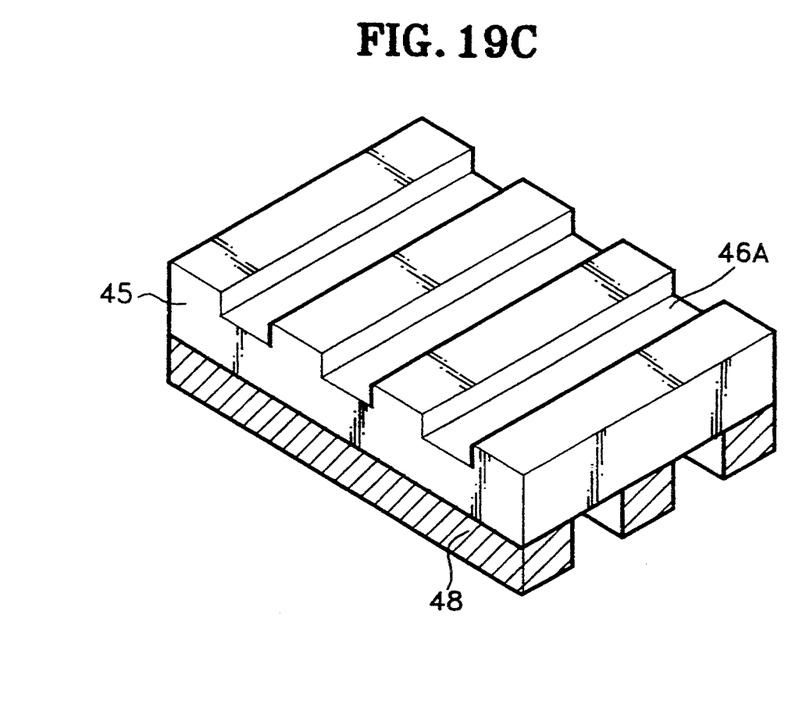

FIG. 19C illustrates a step of forming a second photoresist pattern. A photoresist is additionally coated on the back surface of mask substrate 45 in the same manner as described with respect to FIG. 19A, to thereby form a second photoresist film, which then is exposed and developed to form a second photoresist pattern 48 for forming a second grating pattern in the Y-axis direction.

Figure 19D:
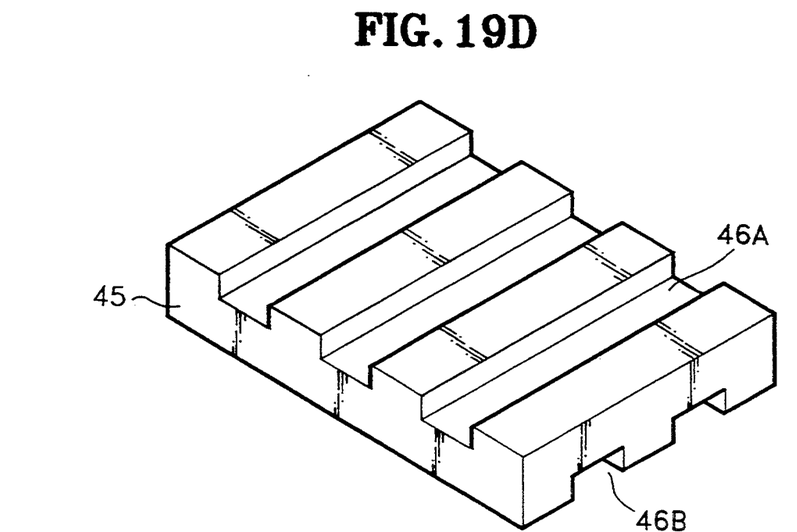

FIG. 19D illustrates a step of forming a second grating pattern 46B in the Y-axis direction. Second grating pattern 46B being arrayed in the Y-axis direction is formed by etching mask substrate 45 using second photoresist pattern 48 as an etching mask.

Thereafter, grating mask substrate 45 having grating pattern 45A and 45B arrayed in the X- and Y-axis directions is attached to the back surface of the mask substrate on which a conventional chrome pattern is formed, using a pellicle frame, to thereby obtain the mask of the present invention as shown in FIG. 16.

Pattern formation

In an exposure system having an NA of 0.5 using an i-line (λ=365 nm), the conventional resolution limit was an order of 0.5 μm. Using this conventional exposure system, a pattern was formed according to a conventional projection exposure method and using a projection exposure system wherein the mask of the present invention as shown in FIG. 6C was provided, a pattern was formed according to a method of the present invention.

Here, the grating pattern was formed on the grating mask substrate so that the light path difference is 180° while changing the cycle (pitch) of the grating pattern. That is, the quartz mask substrate was patterned so that the grating pattern has a depth (d) of 0.365 μm/2(n−1).

According to a method of the present invention, a 0.28 μm-sized pattern (about 0.38λ/NA) was resolved while only a 0.36 μm-sized pattern was attained by the conventional method.

When the exposure process is performed using the mask of the present invention, the vertical component of the light is removed by the mutual interference and only an oblique component thereof remains, as shown in FIG. 6C. That is, zero-order diffracted light and second-order diffracted light interferes and are removed while first, third, . . . order diffracted light remains. However, in practice, higher-order (above the third-order) diffracted light hardly exists.

Accordingly, most of the quantity of transmission light is obtained by first-order light and transmission efficiency becomes remarkably higher when compared with the conventional method. As a result, the resolution was improved to 0.4 μm or below, and a DOF of up to 2.2 μm is assured.

Figure 20:
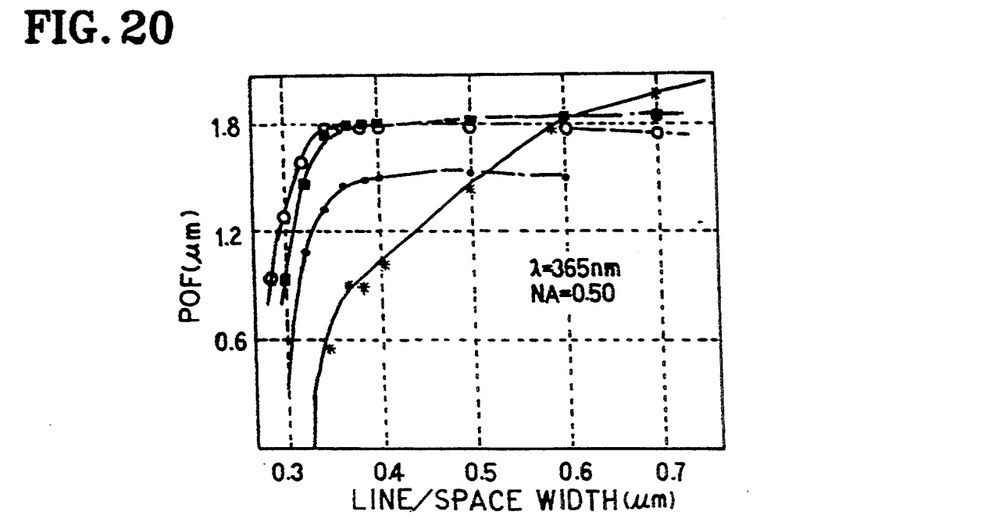
FIG. 20 illustrates a graph showing a depth of focus when the various patterns are exposed by the above conventional method and by the exposure method of the present invention.

FIG. 20 illustrates a graph showing a depth of focus when the various patterns are exposed by the above conventional method and by the exposure method of the present invention. In FIG. 20, the asterisks illustrates the case of the conventional exposure method, the symbol ● illustrates the case of the pitch of grating pattern being 5 μm, the symbol ○ illustrates the case of the pitch of grating pattern being 6 θm, and the symbol ■ illustrates the case of the pitch of grating pattern being 7 μm. As can be seen in FIG. 20, the depth of focus is improved remarkably when patterns below one half micron were formed.

When a pattern was formed using excimer stepper of 0.45NA KrF according to the conventional exposing method, a 0.28 μm-sized pattern could be obtained. However, according to the method of the present invention, a 0.22 μm-sized pattern could be obtained and the 2.0 μm depth of focus was achieved.

In addition to this, the linearity of formed pattern is excellent, to thereby increase the efficiency of the exposure process.

Figure 21:
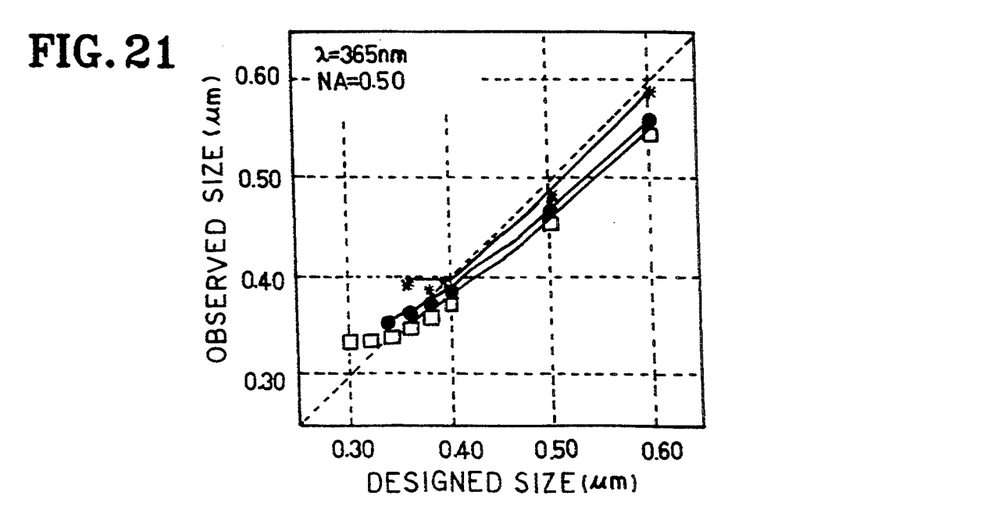
FIG. 21 illustrates a graph showing the sizes of a designed pattern and the actually measured pattern, when the pattern is exposed by the conventional method and a projection method for exposing an object of the present invention.

FIG. 21 illustrates a graph showing the sizes of designed pattern versus the actually measured pattern, when the pattern is exposed by the conventional method and a projection method for exposing an object of the present invention. In FIG. 21, the symbols □ and ● illustrate the patterns obtained according to the present invention, and the asterisk illustrates the patterns obtained according to the conventional method. As can be seen in FIG. 21, the pattern linearity is improved remarkably up to a pattern size of 0.4 μm or below.

As described above, resolution is improved only in the parallel pattern when the mask grating is formed in one regular direction. Accordingly, the grating is provided to be grouped according to the mask pattern in order to achieve the best resolution, to thereby optimize the vertical, horizontal and oblique patterns. Specifically, for highly integrated memory devices, grouping the pattern is not difficult and the application of the method of the present invention is easy.

Additionally, when very high resolution is unnecessary, resolution can be improved by forming a checkerboard type grating pattern as described in one embodiment of the present invention, whereby the vertical and horizontal improvement of resolution is possible.

Further, the grating pattern is formed on both sides of a grating mask substrate to be perpendicularly arrayed in the X- and Y-axis directions, which enables the improvement of X-axis and Y-axis resolution simultaneously.

As described above, since the illumination method according to the present invention brings little loss in light transmission when compared to the method which uses the conventional filter, the light transmission efficiency is increased by 200~400% (or more) and the obliquely incident illumination effect may be achieved as in the conventional method, to thereby improve productivity.

Additionally, in the conventional method, uniformity is lowered by blocking the light by the use of an installed filter. In the meantime, in the present invention, the blocking of the light does not occur since the filter is not used. Therefore, the deterioration of the uniformity of the exposure intensity does not occur.

Further, since merely providing a grating mask or patterning another surface of a conventional mask into a grating pattern may achieve the excellent effect of modified illumination, the alignment between the phase shift mask and a mask for pattern transcription is unnecessary, which results in the production of a mask which has a high resolution with a low cost and accomplished in a simplified manner. Additionally, higher resolution can be realized through optimization in accordance with each pattern size.

When the grating mask of the mask of the present invention is attached to the conventional mask using a pellicle frame as a support band between the grating mask and the conventional mask, abrasion between the grating mask and the conventional mask is prevented.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A projection exposure system for exposing an object comprising:
   a light source with a condenser lens;
   a mask having respective first and second opposed surfaces, the respective first surface of said mask disposed for receiving light from said light source as condensed by said condensing lens, and the respective second surface of said mask having a selectively opaque pattern disposed thereon, which said selectively opaque pattern includes at least one alignment mark;
   a projection lens for projecting light passing through the second surface of said mask and by said selectively opaque pattern; and
   a transparent substrate interposed between said light source with said condenser lens and said mask, said transparent substrate having first and second opposed surfaces, having its first surface disposed for irradiation by light from said light source as condensed by said condenser lens, having its second surface parallel to the first surface of said mask for passing light thereto, and having a grating pattern comprised of regular patterns formed on at least one of its first and second surfaces, whereby zero-order diffracted light interferes and is removed by a phase difference of light as transmitted to portions of said selectively opaque pattern exclusive of each said alignment mark.

2. A projection exposure system according to claim 1, wherein a first grating pattern is formed on the first surface of said transparent substrate and a second grating pattern is formed on the second surface of said transparent substrate.

3. A mask comprising:
   a transparent substrate having opposed first and second surfaces;
   a mask pattern formed on the first surface of said transparent substrate for defining an exposure region of an object by selectively obstructing the passage of light, said mask pattern including at least one alignment mark; and
   a grating pattern formed on the second surface of said transparent substrate at regular intervals, whereby light interferes by a phase difference of light so that even-numbered-order diffracted light is removed while odd-numbered-order diffracted light is enhanced, said grating pattern being substantial coextensive with said mask pattern but having an aperture therein opposite each said alignment mark.

4. A mask according to claim 3, wherein said grating pattern is a pattern obtained by patterning the back surface of said transparent substrate.

5. A mask according to claim 3, wherein said grating pattern is comprised of a material different from the material of said transparent substrate.

6. A mask according to claim 3, said grating pattern is formed by patterning a pellicle.

* * * * *